United States Patent [19]

Hammer

[11] Patent Number: 5,303,316
[45] Date of Patent: Apr. 12, 1994

[54] OPTICAL BEAM SCANNER

[75] Inventor: Jacob M. Hammer, Princeton, N.J.

[73] Assignee: David Sarnoff Research Center, Inc., Princeton, N.J.

[21] Appl. No.: 455,053

[22] Filed: Dec. 22, 1989

[51] Int. Cl.$^5$ ............................................. G02B 6/34
[52] U.S. Cl. ...................................................... 385/37
[58] Field of Search ..................... 350/96.19; 385/37

[56] References Cited

U.S. PATENT DOCUMENTS

| | | | |
|---|---|---|---|
| 4,006,963 | 2/1977 | Baues et al. | 385/10 |
| 4,571,024 | 2/1986 | Husbands | 385/37 |
| 4,743,087 | 5/1988 | Utaka et al. | 350/96.19 |
| 4,760,569 | 7/1988 | Mahlein | 385/37 |
| 4,778,236 | 10/1988 | Miyawaki | 350/96.14 |
| 4,786,128 | 11/1988 | Birnbach | 350/96.14 |
| 4,799,750 | 1/1989 | Miyawaki | 350/96.13 |

OTHER PUBLICATIONS

G. Evans et al. "Two-Dimensional Coherent Laser Arrays Using Grating Surface Emissions", *IEEE Journal of Quantum Electronics*, vol. 25, No. 6, Jun. 1989.

B. Broberg et al. "Widely Tunable Active Bragg Reflector Integrated Lasers In GaAsP-InP" *Applied Physics Letter*, vol. 52 No. 16 Apr. 18, 1988 pp. 1285-1287.

*Primary Examiner*—Rodney B. Bovernick
*Assistant Examiner*—Robert E. Wise
*Attorney, Agent, or Firm*—William J. Burke

[57] ABSTRACT

An optical device having a substrate with a waveguide layer on a surface thereof and a grating in the waveguide. The grating has a period such as to deflect light passing along the waveguide out of the optical device. The angle at which the light is emitted from the waveguide can be varied by varying the index of refraction of the material of the waveguide under the grating. This can be achieved by applying a voltage across the waveguide.

7 Claims, 1 Drawing Sheet

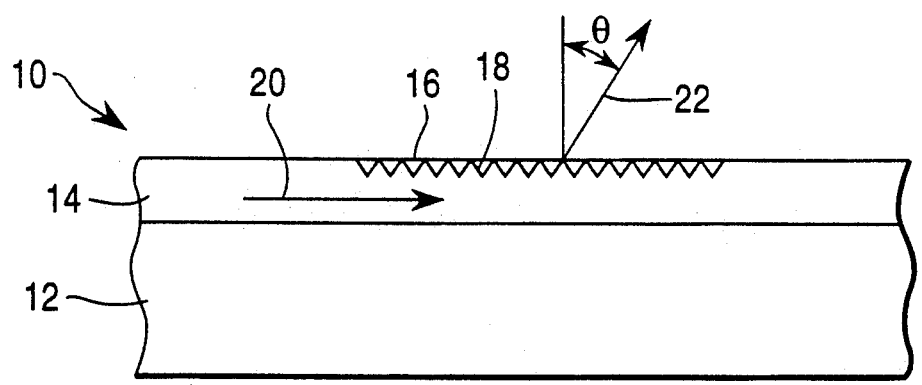
FIG. 1
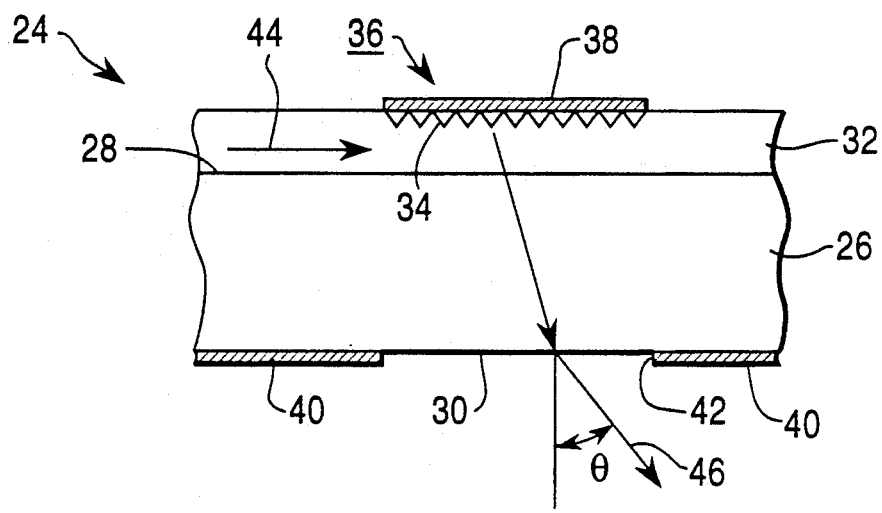
FIG. 2
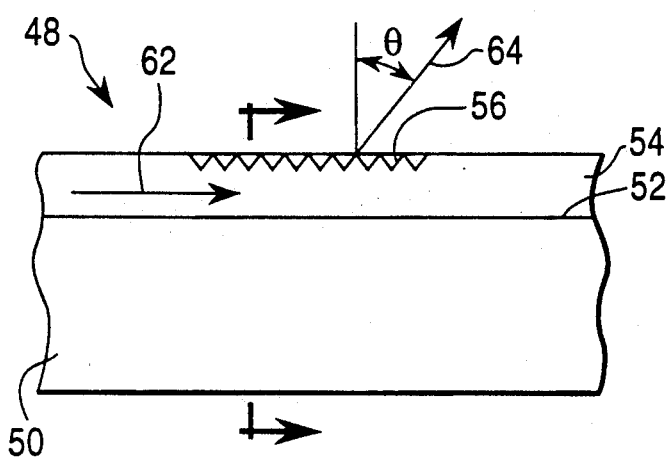 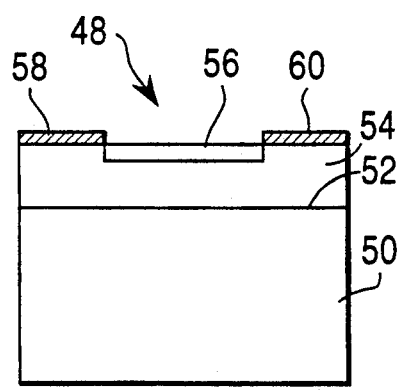
FIG. 3      FIG. 4

OPTICAL BEAM SCANNER

FIELD OF THE INVENTION

The present invention relates to a waveguide grating optical beam scanner, and, more particularly, to a waveguide grating in which the effective index of refraction of the waveguide is changed to change the angle of the emitted beam of light.

BACKGROUND OF THE INVENTION

Various electrical components used in optical communications include a waveguide and a grating along the waveguide through which light is directed out of the waveguide. For example, grating-surface-emitting lasers such as described in the article of Gary A. Evans et al, entitled "Two Dimensional Coherent Laser Arrays Using Grating Surface Emission", published in IEEE JOURNAL OF QUANTUM ELECTRONICS, Vol. 25, No. 6, June 1989, pages 1525-1538, comprise a substrate having therein an active region wherein light is generated when a voltage is applied thereacross. The active region includes a waveguide along which the generated light travels. Across the waveguide at one end of the active region is a grating which directs some of the light out of the substrate through a surface of the substrate at an angle to the surface. Various techniques are used to adjust the angle at which the light is emitted from the waveguide including adjusting the period of the grating. However, it is often desirable to be able to change the angle of emission of the light beam during the operation of the device, or to be able to scan the emitted light beam.

SUMMARY OF THE INVENTION

The present invention relates to an optical device which includes a substrate having a surface and a waveguide therein extending substantially parallel to the surface. A grating extends across the waveguide to direct light out of the waveguide through the surface. The device includes means for varying the effective index of refraction of the waveguide so as to change the angle that the light is emitted from the waveguide.

BRIEF DESCRIPTION OF THE DRAWINGS

FIG. 1 is a schematic view of a grating surface emitting waveguide;

FIG. 2 is a sectional view of one form of a waveguide in accordance with the present invention;

FIG. 3 is a sectional view of another form of a waveguide of the present invention; and FIG. 4 is sectional view taken along line 4—4 of FIG. 3.

DETAILED DESCRIPTION OF PREFERRED EMBODIMENTS

Referring to FIG. 1, there is shown an optical device 10 which comprises a substrate 12 having a waveguide layer 14 thereon. A grating 16 is provided in the surface of the waveguide layer 14. As shown, the grating 16 if formed of a plurality of spaced, parallel V-shaped grooves 18 extending across the surface of the waveguide layer 14. However, any other type of grating can be used. Light is adapted to travel along the waveguide layer 14 as indicated by the arrow 20. The grating 16 is adapted to couple the light out of the waveguide layer 14 as indicated by the arrow 22 at an angle O. In the optical device 10 of the present invention, the coupling angle O at which the light is emitted from the waveguide layer 14 can be varied by changing the effective refractive index of the guided mode. The effective index of the mode can be changed by varying the refractive index of any or all of the layers which make up the optical waveguide 14. This may be accomplished by applying an electric field through electrodes placed on the waveguide. If the waveguide is made of an electrooptic material, such as $LiNbO_3$, the refractive index will be changed because of the linear electrooptic, Pockels, effect. If the waveguide is made of a semiconductor material, such as AlGaAs, the refractive index can be changed by either the Pockels effect or by injected carriers. In some orientations it will be possible to use both effects.

Light flowing in the waveguide layer 14 is coupled out of the layer at the angle O which is governed by the following relation:

$$n_o \sin O = n_e - m_c \lambda$$

where $n_o$ is the refractive index of the space into which the light is coupled, $n_e$ is the effective refractive index of the guided mode, $\lambda$ is the free space wavelength, $\Lambda$ is the grating period, and $m_c$ is an integer representing the order of coupling. It can be seen from this equation that the angle O may be changed by changing the effective index of the guide mode.

Referring to FIG. 2, one form of an optical device which incorporates the present invention is generally designated as 24. The optical device 24 comprises a substrate 26 of a semiconductor material, such as $Al_{.4}Ga_{.6}As$, having opposed surfaces 28 and 30. On the surface 28 of the substrate 26 is a waveguide layer 32 of a semiconductor material having an energy band-gap different from that of the substrate 26, such as $Al_{.2}Ga_{.8}As$. A plurality of spaced, parallel V-shaped grooves 34 are in the surface of the waveguide layer 32 forming a grating 36. A layer 38 of a conductive metal, such as gold, is over the grooves 34 to form an electrode. A layer 40 of a conductive metal, such as gold, is on the surface 30 of the substrate 26 to form a second electrode. The electrode layer 40 has an opening 42 therethrough under the grooves 34 of the grating 36.

In the operation of the optical device 24, light is directed along the waveguide layer 32 as indicated by the arrow 44. The grating 36 has a period such as to deflect the light out of the waveguide layer 32, through the substrate 26 and out of the device 24 through the opening 42 in the electrode 40 as indicated by the arrow 46. The light is emitted from the optical device 24 at an angle O. The angle O can be changed by applying a voltage across the optical device 24 by means of the electrodes 38 and 40. As stated above, this will change the angle O either by the Pockels effect or by injected carriers.

Referring to FIGS. 3 and 4, another form of an optical device which incorporates the present invention is generally designated as 48. The optical device 48 comprises a substrate 50 of $LiNbO_3$ having a surface 52. A waveguide layer 54 of $TiLiNbO_3$ is on the surface 52 of the substrate 50. A plurality of spaced, parallel V-shaped grooves 56 extending across a portion of the surface of the waveguide layer 54 to form a grating. As shown in FIG. 4, a pair of layers 58 and 60 of a conductive metal are on the surface of the waveguide layer 54 and extending along opposite sides of the grating grooves 56. The conductive layers 58 and 60 form a pair of electrodes.

In the operation of the optical device 48, a beam of light is directed along the waveguide layer 54 as indicated by the arrow 62 in FIG. 3. The grating grooves 56 are of a period to deflect the light beam out of the waveguide layer 54 as indicated by the arrow 64 at an angle O. By applying a voltage across the electrodes 58 and 60 and through the waveguide layer 54, the refractive index of the waveguide layer 54 is varied by the Pockels effect to vary the angle O that the light beam leaves the waveguide layer 54.

The optical devices 24 and 48 may be made by depositing the waveguide layers 32 and 54 on the surface of their respective substrates 26 and 50 using any well know chemical vapor deposition technique for the particular material of the waveguide layer. The grooves of the grating may be formed by photolithography and etching. The contacts may be applied by either evaporation in a vacuum or sputtering.

Thus, there is provided by the present invention an optical device having a waveguide and a grating for deflecting light in the waveguide out of the device in which the angle that the light is deflected from the waveguide can be varied by placing a voltage across the waveguide to change the index of refraction of the waveguide. This provides a simple method of varying the angle that the light beam leaves the optical device so as to permit scanning of the light beam. Although the grating has been shown as being formed of grooves, it can be any know type of grating, such as regions of different indicies of refraction.

What is claimed is:

1. An optical device comprising:
    a substrate having a surface;
    a waveguide along and substantially parallel to said substrate surface;
    a grating extending across said waveguide designed to deflect light substantially transversely out of the waveguide; and
    means for varying the index of refraction of said waveguide so as to change the angle that the light is emitted from the waveguide.

2. The optical device of claim 1 in which the means for varying the index of refraction of the waveguide comprises means for applying a voltage across the waveguide at the grating.

3. The optical device of claim 2 in which the grating comprises a plurality of space, parallel grooves extending across the waveguide.

4. An optical device comprising:
    a substrate having a pair of opposed surfaces;
    a waveguide layer on one of said substrate surfaces;
    a grating in said waveguide layer, said grating having a period such as to deflect light passing along said waveguide out of the waveguide at said grating; and
    means for applying a voltage across the waveguide substantially transversely layer at the grating to change the index of refraction of the waveguide layer and thereby vary the angle at which the light is emitted from the optical device.

5. The optical device of claim 4 including a pair of electrodes on said optical device by which a voltage is applied across the waveguide layer.

6. The optical device of claim 5 in which one electrode is over the grating and the other electrode is on the other surface of the substrate.

7. The optical device of claim 5 in which the electrodes are on the surface of the waveguide layer along opposite edges of the grating.

* * * * *